United States Patent
Edelstein et al.

(10) Patent No.: US 6,670,809 B1
(45) Date of Patent: Dec. 30, 2003

(54) MAGNETIC SENSOR WITH MODULATING FLUX CONCENTRATOR HAVING MINIMIZED AIR RESISTANCE FOR 1/F NOISE REDUCTION

(75) Inventors: Alan S. Edelstein, Aalexandria, VA (US); David Hull, Adelphi, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/135,392

(22) Filed: May 1, 2002

Related U.S. Application Data (63) Continuation-in-part of application No. 09/641,370, filed on Aug. 18, 2000, now Pat. No. 6,501,268.

(51) Int. Cl.[7] .................... G01R 33/02; G01R 33/025; G01R 33/06
(52) U.S. Cl. ................ 324/244; 324/225; 324/251; 324/252; 324/259
(58) Field of Search .............. 324/225, 244–260, 324/117 R, 117 H, 345; 33/355 R, 356, 357, 363 R; 338/32 R, 32 H; 600/409

(56) References Cited

U.S. PATENT DOCUMENTS

| | | | | |
|---|---|---|---|---|
| 4,587,509 A | * | 5/1986 | Pitt et al. ................ 324/251 X |
| 4,692,703 A | * | 9/1987 | Extance et al. ............. 324/251 |
| 4,864,237 A | * | 9/1989 | Hoenig ........................ 324/248 |
| 4,916,821 A | * | 4/1990 | Potter ........................... 33/362 |
| 5,260,653 A | * | 11/1993 | Smith et al. ................. 324/252 |
| 5,493,220 A | * | 2/1996 | Oliver et al. ........ 324/244.1 X |
| 5,942,895 A | * | 8/1999 | Popovic et al. ............. 324/251 |
| 6,201,629 B1 | * | 3/2001 | McClelland et al. ........ 359/223 |
| 6,501,268 B1 | * | 12/2002 | Edelstein et al. ........... 324/244 |

* cited by examiner

*Primary Examiner*—Gerard R. Strecker
(74) *Attorney, Agent, or Firm*—William V. Adams; Edward L. Stolarun (57) ABSTRACT

A magnetic sensing transducer device that senses low frequency magnetic fields by using flux concentrators that modulate the observed low frequency signal, thereby shifting this observed signal to higher frequencies and minimizing 1/f-type noise. This is accomplished by the oscillatory motion of a microelectromechanical (MEMS)-type magnetic flux concentrator operated with a magnetic sensor, preferably made on a common substrate. Such a combined device can be used in a magnetometer. Such a device is small, low-cost and has low-power-consumption requirements. The magnetic sensor can be a Hall effect or other type of magnetic sensor. At least one MEMS-type fabricated flux concentrator is used with the magnetic sensor. The concentrator oscillates at a modulation frequency much greater than the observed magnetic field being sensed by the device.

20 Claims, 6 Drawing Sheets

ELECTRODE LEADS TO MAGNETIC SENSOR

MAGNETIC SENSOR WITH MODULATING FLUX CONCENTRATOR HAVING MINIMIZED AIR RESISTANCE FOR 1/F NOISE REDUCTION

CROSS-REFERENCE TO RELATED APPLICATIONS

This application is a continuation-in-part of prior U.S. patent application Ser. No. 09/641,370 filed on Aug. 18, 2000, now U.S. Pat. No. 6,501,268 which is hereby expressly incorporated by reference.

STATEMENT OF GOVERNMENT INTEREST

The invention described herein may be manufactured and used by or for the United States Government for governmental purposes without the payment of any royalties thereon.

BACKGROUND OF THE INVENTION

The present invention relates generally to magnetic transducers, and more particularly, to magnetic sensors used with a microelectromechanical system (MEMS)-type components.

Interest is increasing in the development of miniature sensors for sensing magnetic fields in extraterrestrial, industrial, biomedical, oceanographic, and environmental applications. The trend in magnetic sensor design and development is constantly toward smaller size, lower power consumption, and lower cost for similar or improved performance.

There are several types of magnetometers (magnetic sensors with external instrumentation) currently used. The least expensive and least sensitive devices have resolution of about $10^{-1}$ Oersted (Oe)/Hz$^{1/2}$ and typically are Hall effect devices. These devices work by sensing a voltage change across a conductor or semiconductor placed in a magnetic field. Such devices do not lend themselves for applications requiring greater sensitivity, such as that required in brain scan devices and magnetic anomaly detection devices. Flux gate magnetometers are more sensitive, having resolution of approximately $10^{-6}$ Oe/Hz$^{1/2}$. Flux gate magnetometers use a magnetic core surrounded by an electromagnetic coil and are difficult to microfabricate. Additionally flux gate magnetometers require relatively large amount of power and accordingly do not lend themselves to low-cost, compact, portable design. The most sensitive magnetometers called SQUIDS (superconducting quantum interference detectors) have a resolution of about $10^{-10}$Oe/Hz$^{1/2}$. However, because they include a superconducting element, these apparatus must include cooling means at liquid gas temperatures, making them extremely bulky and expensive to operate. Their size limits their utility because the active superconducting element cannot be placed directly adjacent to the source of the magnetic field, for example the brain. Accordingly, there is need for small, inexpensive, low power magnetometers that have sufficient sensitivity to be useful for a variety of magnetometer applications at low frequencies. Magnetoresistive sensors are suited for low-cost, medium-sensitivity application. For example, using spin-dependent tunneling magnetoresistive sensors, one can observe 38% changes in the resistivity in fields of a few Oe, see D. Song, J. Nowak & M. Covington, J. Appl. Phys, 87, 5197 (2000).

A well known way of increasing the sensed magnetic field by a magnetic sensor is by use of a flux concentrator, which can enhance a sensed magnetic field by as much as a factor of 50, see N. Smith et al., IEEE Trans. Magn. 33, p. 3358 (1997). An example of such a device is taught in U.S. Pat. No. 5,942,895, entitled "Magnetic field sensor and current and/or energy sensor," that use Hall sensors with flux concentrator components.

Magnetic sensors used to detect objects that move slowly typically possess considerable low frequency 1/f-type noise, an unwanted condition. In general, there is a tendency for such devices that have higher sensitivity to also exhibit higher 1/f-type noise. This generally occurs when using magnetoresistive-type magnetic sensors, see van de Veerdonk et al. J. Appl. Phys. 82, 6152 (1997).

A magnetic sensor (magnetometer) that addresses 1/f-type noise is taught in U.S. Pat. No. 4,864,237. This disclosure teaches of an apparatus for measuring magnetic fields, that change only at extremely low frequencies. The apparatus uses a SQUID magnetometer that includes a superconducting flux transformer that inductively couples a detected signal into a d-c SQUID sensor. This magnetometer can optionally include a device for modulating the detected signal in a frequency range characteristic of low-noise operation of the SQUID. The modulation frequencies are generally above 1 Hz and optionally even above 1-kHz. Limitations of this device include need for cryogenic operation, which inherently do not lend themselves to relatively lost cost, low power use.

Thus, there is need, for small, low-cost, low-power-consuming magnetic sensors having sensitivities capable of meeting the varied applications listed above for detecting low frequency signals and minimize 1/f-type noise.

SUMMARY OF THE INVENTION

It is an object of this invention to provide a magnetic sensor with flux concentrator having sufficient sensitivity for a variety of applications that minimize the effects of 1/f-type noise.

It is a further object of this invention to provide such a magnetic sensor with flux concentrator that is inexpensive to manufacture, having a magnetic sensor having high sensitivity, yet not having to be concerned with 1/f-type noise associated with that type of sensor.

It is a further object of this invention to provide such a magnetic sensor with a flux concentrator that uses relatively little power.

It is a further object of this invention to provide such a magnetic sensor with flux concentrator that can be readily produced by microfabrication MEMS-techniques.

This invention results from the realization that a small and inexpensive yet extremely sensitive magnetic sensor, may be accomplished by oscillating a torsionally suspended flux concentrator or a flux concentrator that can rotate or oscillate about an axis.

The invention improves the sensitivity of magnetic sensors in general that operate at low frequencies by using flux concentrators that modulate an observed sensed magnetic field with low frequency signals, thereby shifting this observed field to higher frequencies where the noise of the sensor is smaller to minimize 1/f-type noise. This is accomplished by providing a torsionally suspended microelectromechanical (MEMS)-type magnetic flux concentrator or a flux concentrator that can rotate or oscillate about some axis in combination with a magnetic sensor, preferably on a common substrate. Such a combined device is used in a magnetonmeter. Such a device is small, low-cost and has low-power-consumption requirements. The magnetic sensor can be a Hall effect or other type of magnetic sensor. At least one torsionally suspended or free to rotate MEMS-type fabricated flux concentrator is used with the magnetic sensor. The torsionally suspended flux concentrator is a flux concentrator that can rotate or oscillate about some axis at a modulation frequency much greater than an observed lower-frequency signal being sensed.

BRIEF DESCRIPTION OF THE DRAWINGS

The foregoing and other objects, features, and advantages of the invention will be apparent from the following more detailed description of the preferred embodiments of the invention, as illustrated in the accompanying drawings, wherein.

DETAILED DESCRIPTION OF THE PREFERRED EMBODIMENTS

Figure 1:
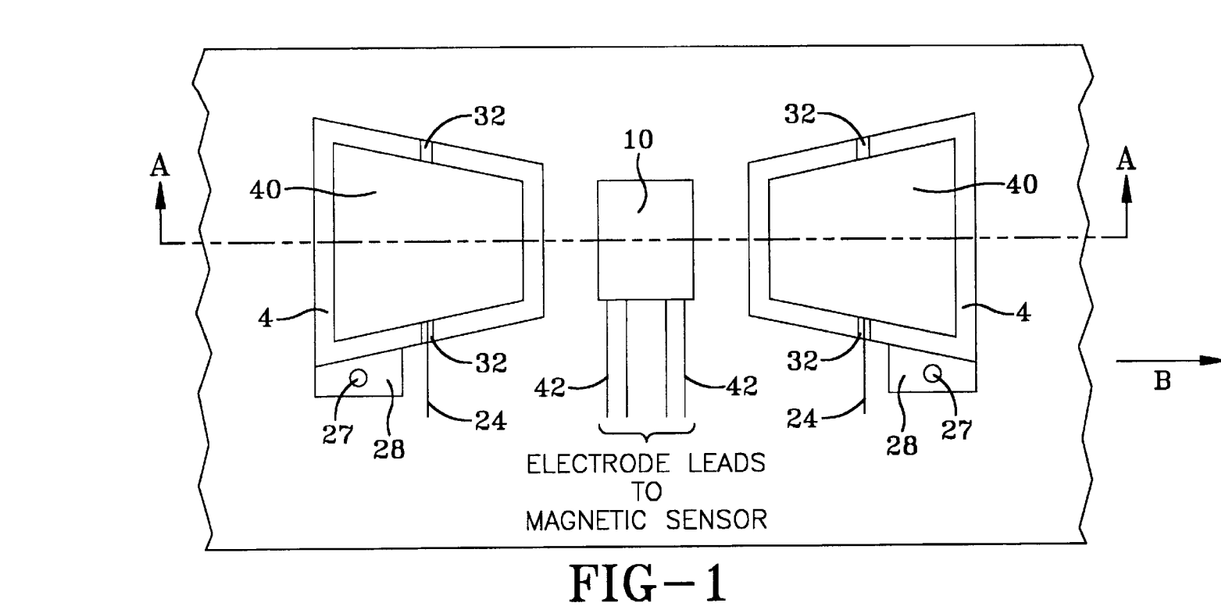
FIG. 1 shows the invention of a flux concentrator in combination with a magnetic sensor using MEMS fabrication in a plan view.
Figure 2:
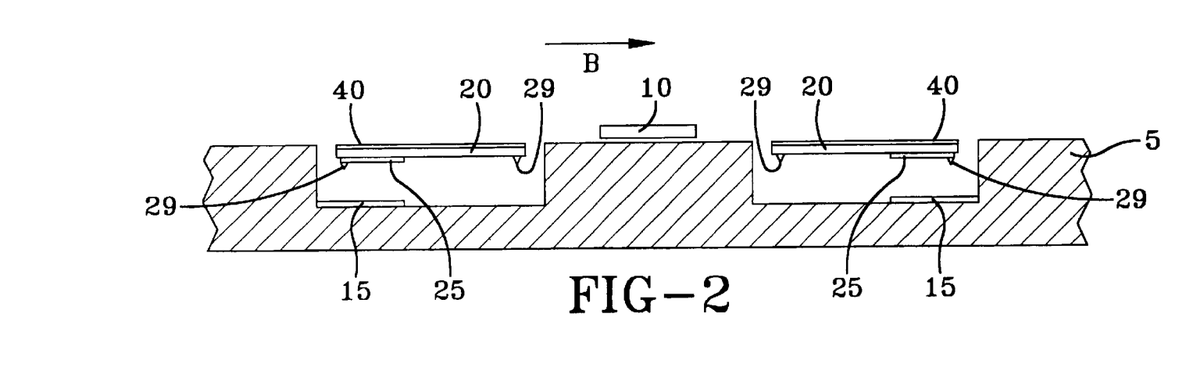
FIG. 2 shows FIG. 1 in cross-section along line A—A.

Referring to FIGS. 1 and 2, an exemplary form of the device using the concepts of the invention is shown that includes a magnetic sensor 10 with two flux concentrators 40 that can oscillate about an axis (torsional suspension member 32). Each flux concentrator 40 increases the sensed magnetic flux density at the position of the sensor 10 when the flux concentrators are in the horizontal position, i.e., the plane of the substrate. A layered material forming part of the flux concentrator 40 can comprise a thick film of a soft ferromagnetic material with a large magnetic permeability.

In a preferred form, the sensor 10 comprises films deposited on a silicon substrate 5. The flux concentrators 40 are deposited on polysilicon flaps 20. Modulation of a sensed magnetic signal at the magnetic sensor 10 is accomplished by using torsionally suspended flux concentrator members 40 that oscillate about torsional suspension member 32. The polysilicon flaps 20 and torsional suspension members 32 are formed using microelectromechanical system (MEMS) fabrication techniques.

In the magnetometer, the flux concentrators 40 on the polysilicon flaps 20 are driven electrostatically to oscillate at modulating frequency $f_m$ about the torsional suspension member 32 that stably retains the concentrators above the recesses 4 and allows them to oscillate. When these concentrators 40 are in a middle (flat) position (shown in FIG. 2), the sensed magnetic flux is concentrated at the magnetic sensor 10. In operation, when the flux concentrators 40 are rotated to the up and down positions (the edges closest to the sensor 10 are raised above and then lowered below the top surface of substrate 5), the concentrated magnetic field is deflected away from the sensor 10. In these positions, there is minimal enhancement of the flux field sensed by the magnetic sensor.

FIG. 2 is a cross-section along line A—A of FIG. 1. FIG. 2 shows a magnetic field sensor 10, which preferably uses a Hall effect device or a magnetoresistive type magnetic sensor, and two magnetic flux concentrators 40 for strengthening a magnetic field at the position of the sensor 10 in the direction B. Accordingly, the concentrated magnetic field is greatest when the concentrators 40 are substantially aligned with the magnetic sensor 10 as shown in FIG. 2.

The dimensions of the flux concentrators 40 in FIG. 1 typically encompass gross dimensions of 100 by 75 microns, while the thickness of the concentrators is typically around 0.5 to 15 micrometers. Electrode pads 15 (the bottom electrodes) are deposited in the recesses 4 of the substrate 5 and a portion of each electrode pad 15 is covered by a polysilicon flap 28 (more clearly shown in FIG. 3c). Other matching electrode pads 25 (the top electrodes) are deposited on the underside of the polysilicon flaps 20. A polysilicon bump 29 extends from the underside of each polysilicon flap 20. The electrical connections to electrode pads 25 on the of the polysilicon flaps 20 are made by a conductor 24. The electrical connection to the electrode pads 15 is made by a via 27 through each of the polysilicon flaps 28.

The torsional or pivotal oscillating motion of the polysilicon flaps 20 about the torsional suspension member 32 or the axis of rotation is driven electrostatically at a frequency, $f_m$, by applying an AC voltage from a signal generator (not shown) between the electrode pads 15 and 25. These pads are on both the polysilicon flaps 20 and in each of the recesses 4 of the substrate 5. Driving the motion from the signal generator requires very little power. This is especially true if the drive frequency is set equal to the mechanical resonant frequency of the suspended flaps 20 containing the flux concentrators 40. By using the resonant frequency, one obtains the largest amplitudes for the oscillations using the least power. The magnetic field generated by the small currents of the exciting electrostatic modulating signal is negligible.

The magnetic sensor 10 as shown, can be a Hall-effect device wherein four electrical leads 42 (identified as "electrode leads to magnetic sensor" in FIG. 1) are required. Other types of Hall effect devices, which typically have a rectangular geometry with current or voltage electrodes arranged on each side of a rectangle, may also be used. It is also possible to use Hall devices in which three or all four electrodes are arranged on one side of the rectangle, see U.S. Pat. No. 5,057,890. When a Hall effect device is used, an output voltage from such a device results from the Lorentz force of the magnetic field acting on charge carriers within such a device. Other types of magnetic sensors that can be used other than Hall effect devices include flux gate magnetometers and magnetoresistive sensors that include anisotropic magnetoresistive sensors, giant magnetoresistive sensors, spin dependent tunneling sensors, and bismuth, magnetostrictive sensors, and MEMS sensors.

When the magnetic sensor 10 is a magnetoresistive element, a Wheatstone electrical bridge configuration is typically used to interface with the magnetic sensor. When the resistance of the magnetoresistive element changes because of a magnetic field, the bridge output voltage changes. The change in the bridge output is increased by using the flux concentrator. The bridge output voltage is modulated at a frequency $f_m$, typically the resonant frequency of the suspended polysilicon flaps 20, by the motion of the MEMS flux concentrators 40. The signal can then be amplified by a narrow band amplifier and then demodulated. The bandwidth of the amplifier only has to be broad enough to include the low frequencies in the original signal coming into the MEMS flux concentrator.

In its simplest form the flux concentrator comprises a single layer of a soft ferromagnetic material. There are several other alternatives. One is to replace the single layer with many small ellipses in the same plane as the original single layer and with their major axes perpendicular to the sense direction of the magnetic field. The ellipses should be so small that they each comprise a single domain or only a small number of domains. By doing this the magnetization will change primarily by domain rotation. Domain rotation is a lower noise process than domain wall motion. The easy axes of the ellipses will be along their major axes. By having the major axes perpendicular to the field measuring direction, the magnetization will tend to be perpendicular to the field measuring direction. The application of a magnetic field in the field measuring direction will tend to rotate the magnetizations of each ellipse in that direction.

Figure 7:
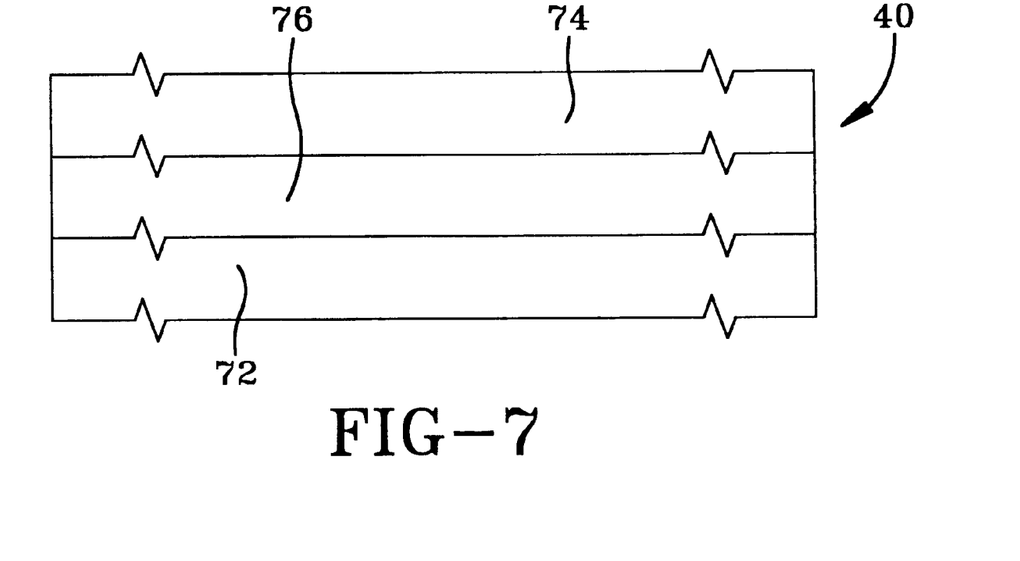
FIG. 7 is a cross-section of one embodiment of a flux concentrator 40.

Alternatively, the flux concentrators 40 can be constructed in multiple layers. In one embodiment shown in FIG. 7, these layers comprise a hard magnetic material (having a coercivity greater than 50 Oersteds) layer 72 and a soft magnetic material (having a coercivity less than 3 Oersteds) layer 74 with equal magnitude magnetizations separated by a spacer layer 76. The spacer layer 76 is a nonmagnetic material, such as aluminum or silicon dioxide the thicknesses of the layers 72, 74 and 76 may be, for example, about one micron. In zero applied field, the magnetizations of both the hard material and the soft material should be perpendicular to the field measuring direction B and directed opposite to one another. Thus, in the absence of an applied field, the fields due to the soft and hard material should approximately cancel one another at the position of the sensor.

Figure 8:
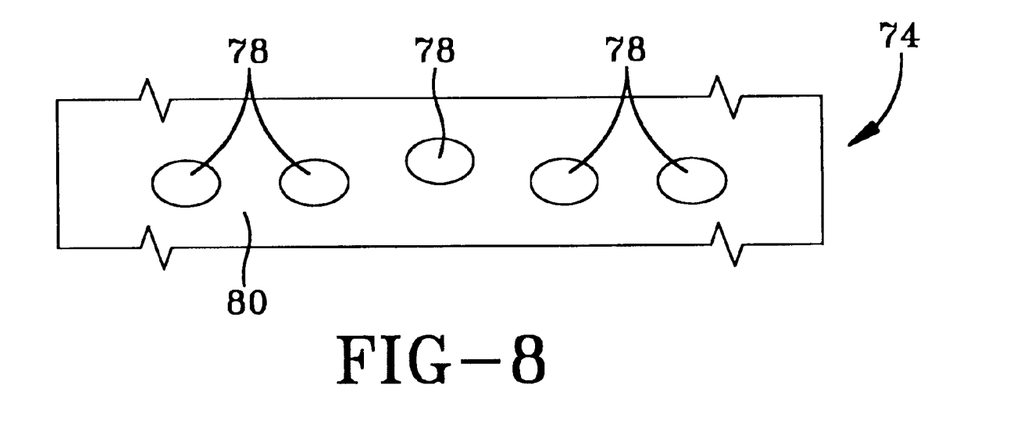
FIG. 8 is a cross-section of one layer of the flux concentrator of FIG. 7.

As shown in FIG. 8, the layer 74 of the soft magnetic material can be a composite of single domain magnetic particles 78 and a nonmagnetic material 80. By restricting magnetic materials to be composed to single domain particles 78, the magnetization within such materials can only change of domain rotation and not domain wall motion. Particles of a soft ferromagnetic material (such as nickel 80 atomic %/iron 20 atomic percent) that are roughly larger than 10 nm and smaller than about 50 nm will be single domain and not superparamagnetic. The volume fraction of the single domain magnetic particles 78 to the noninagnetic material may be up to about 50%. Domain rotation generates much less noise compared to domain wall motion. It is still desirable that the magnetizations of the soft magnetic material and the hard magnetic material cancel in the absence of an external field.

A design can be used wherein the edges of the flux concentrators 40 are modified to decrease the magnetic noise. This can be done by treating the edges of the soft magnetic material of the flux concentrators 40 so that they have slightly higher coercivity than the center. This improves the magnetic response. The rest of the flux concentrator preferably includes a similar three-layer structure with similar arrangement of the magnetizations as described above. The directions of the magnetization can be obtained by processing the flux concentrator in a magnetic field. This overall geometry maximizes the response of the flux concentrator to a field that is applied in the field measuring direction B.

Method of Making the Transducer

The invention is preferably fabricated by MEMS processing techniques. Such techniques are addressed by LIGA (Lithographie, Galvanoformung, Abformung, for "lithography, electroplating molding") micromachining processing methods that use metals, polymers and even ceramics for the production of varied microstructured devices having extreme precision. These collective microstructures are referred to as MEMS-type devices that are alternatives to conventional discrete electromechanical devices such as relays, actuators, and sensors. When properly designed, MEMS-type devices produce useful forces and displacement, while consuming reasonable amounts of power.

Current LIGA processes create features whose top surface is as much as 200-microns above the substrate. Any technology may be used to form the device, whether a LIGA-type process or a bulk plasma micromachining technique such as RIE (reactive ion etching), or a surface micromachining technique using standard photolithography and etching processes yielding the desired configurations. Preferably each flux concentrator 40 is fabricated on a die that in an extreme case might be as large as one square centimeter, but is more likely to be less than one square millimeter in area and about 0.5 to 50 microns thick.

Figure 3A:
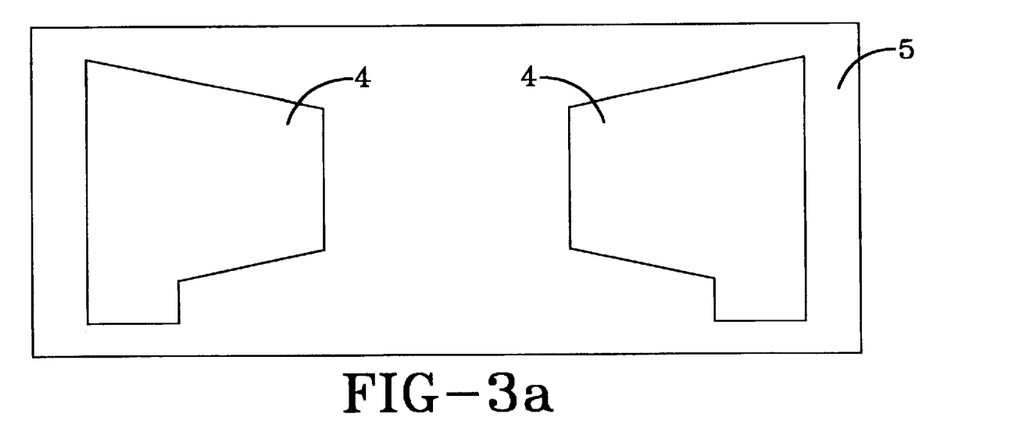
FIGS. 3a, 3b, 3c, 3d, 3e, 3f and 3g show the preferred processing steps involved in making the invention.
Figure 3B:
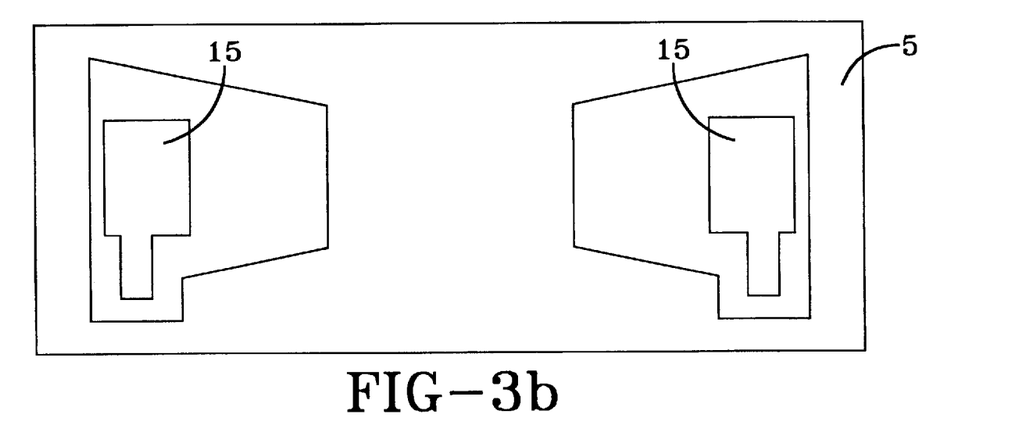
Figure 3C:
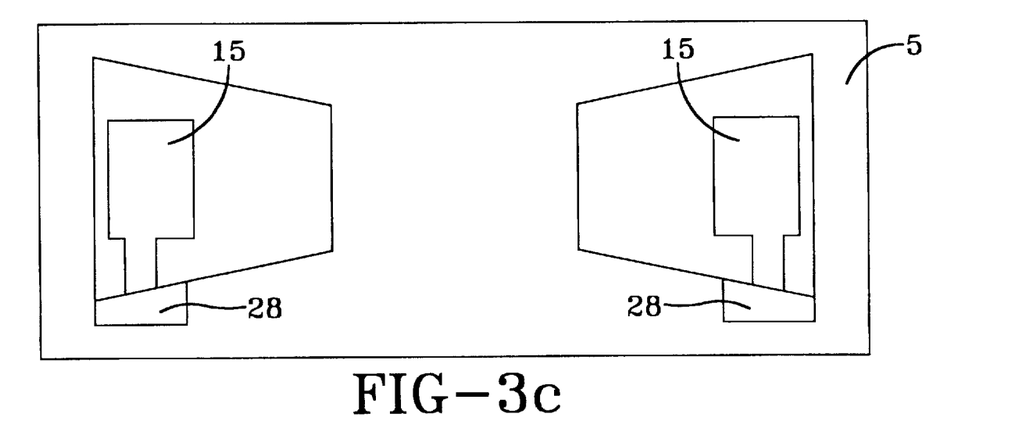
Figure 3D:
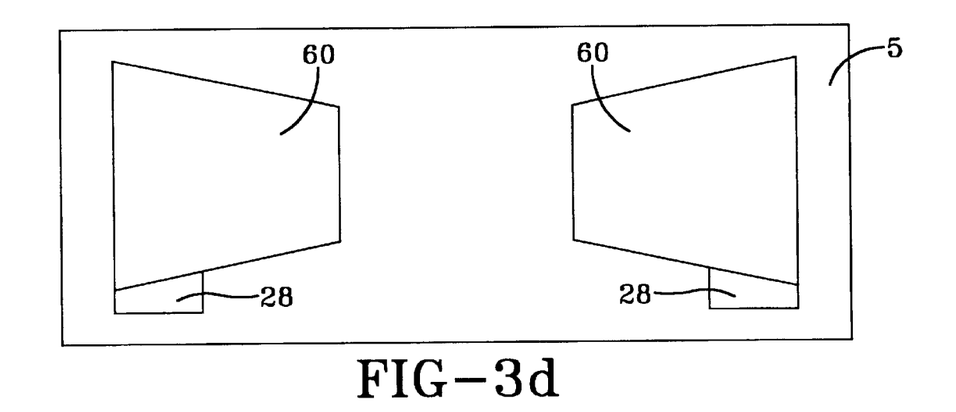
Figure 3E:
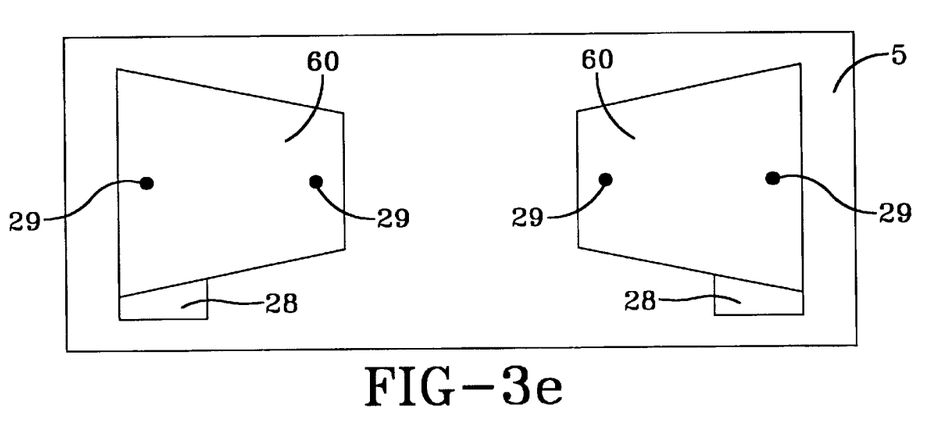
Figure 3F:
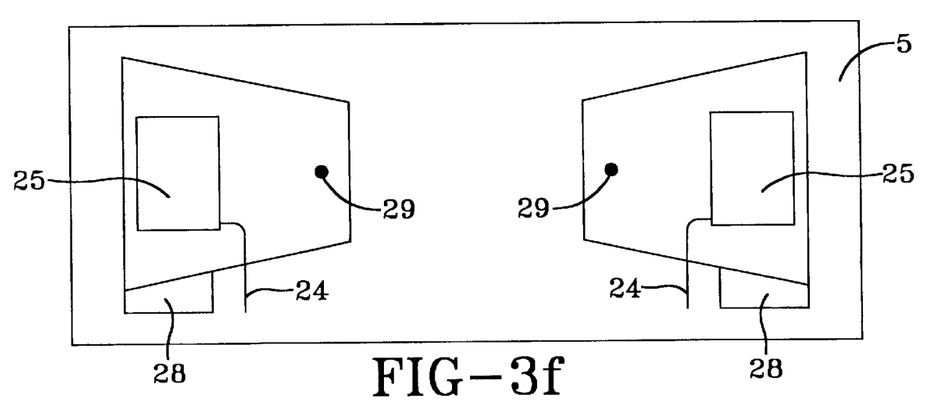
Figure 3G:
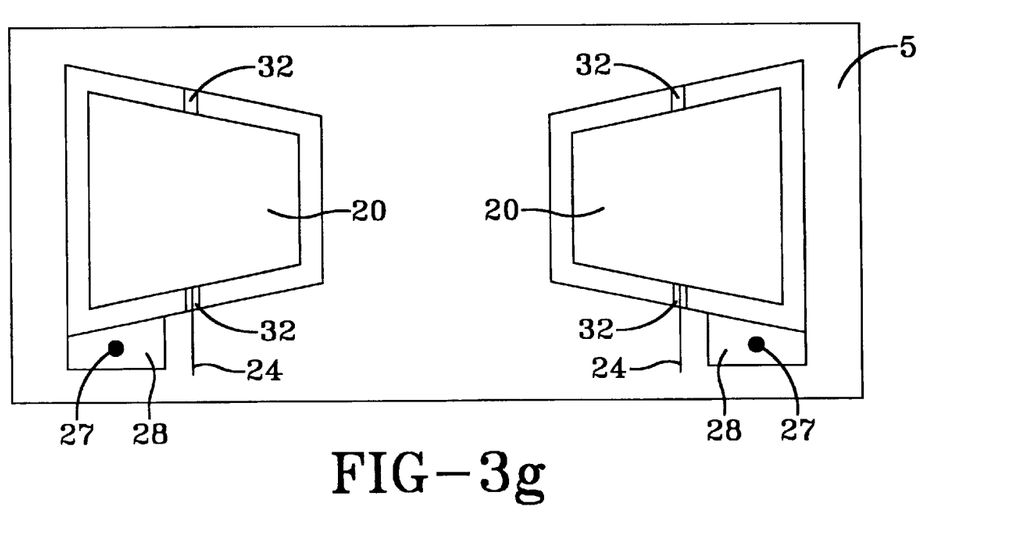
Figure 5:
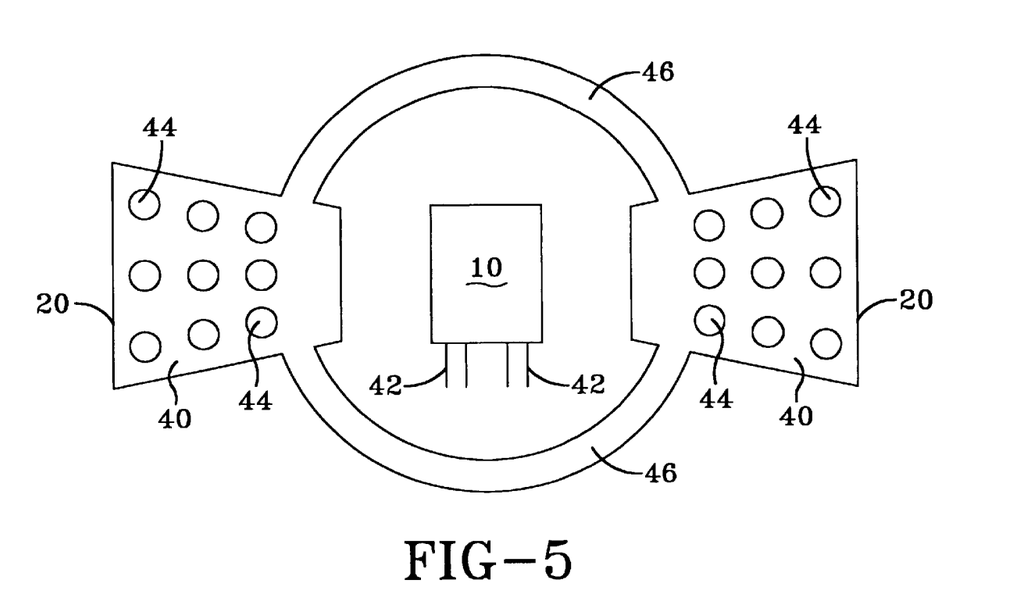
FIG. 5 shows a plan view of the flaps 20, flux concentrators 40 and sensor 10 of FIG. 1.

As mentioned above, preferably, each device is implemented on a single silicon chip or die, but multiple dies also can be used. In a preferred embodiment of the invention, the device is monolithic in its basic configuration. MEMS devices can be readily integrated and interfaced with electronics because they are fabricated much the same way as integrated circuits. The specific MEMS fabrication technique requires only that desired geometries and mechanical and electrical performance characteristics are obtained. The preferred processing steps are as follows and illustrated in FIGS. 3a–3f:

1. Use lithography to define the edge of the recesses 4 as depicted in FIG. 3a.
2. Etch out these recesses 4.
3. Deposit the bottom electrodes 15 as depicted in FIG. 3b.
4. Deposit polysilicon flaps 28 to partially cover bottom electrodes 15 as depicted in FIG. 3c.
5. Deposit a sacrificial material 60 in the recesses 4 as depicted in FIG. 3d.
6. Deposit polysilicon bumps 29 and more sacrificial material 60 as shown in FIG. 3e.
7. Deposit the top electrodes 25 and the conductors 24 to the top electrode as depicted in FIG. 3f
8. Deposit polysilicon flaps 20 and torsional suspension member 32 (and the connectors 46 as shown in FIG. 5, if used) as depicted in FIG. 3g.
9. Make a via 27 through polysilicon flaps 28 to provide an electrical connection to the bottom electrodes 15 as depicted in FIG. 3g.
10. Next, deposit the flux concentrators 40 on top of the polysilicon flaps. The flux concentrator may be a trilayer film or more complicated structure as required.
11. Fabricate the magnetic sensor 10.
12. Remove the sacrificial material 60.

The polysilicon bumps 29 prevent sticking if the top electrodes 25 tend to touch the bottom electrodes 15 or the polysilicon flaps 20 tend to touch the bottom of the recesses 4.

INCREASING THE Q FACTOR

In operation the MEMS flux concentrators 40 perform a rotational oscillation. The amplitude of the oscillation is proportional to $QV^2$ where V is the applied voltage and Q is the traction to energy loss per cycle. To minimize the voltage that must be applied to obtain a sufficient oscillation amplitude it is desirable to have a high Q factor. The major factor that limits the Q factor is air resistance. Air resistance can be minimized either by vacuum packaging the device or by putting holes in the flaps 20.

Figure 4:
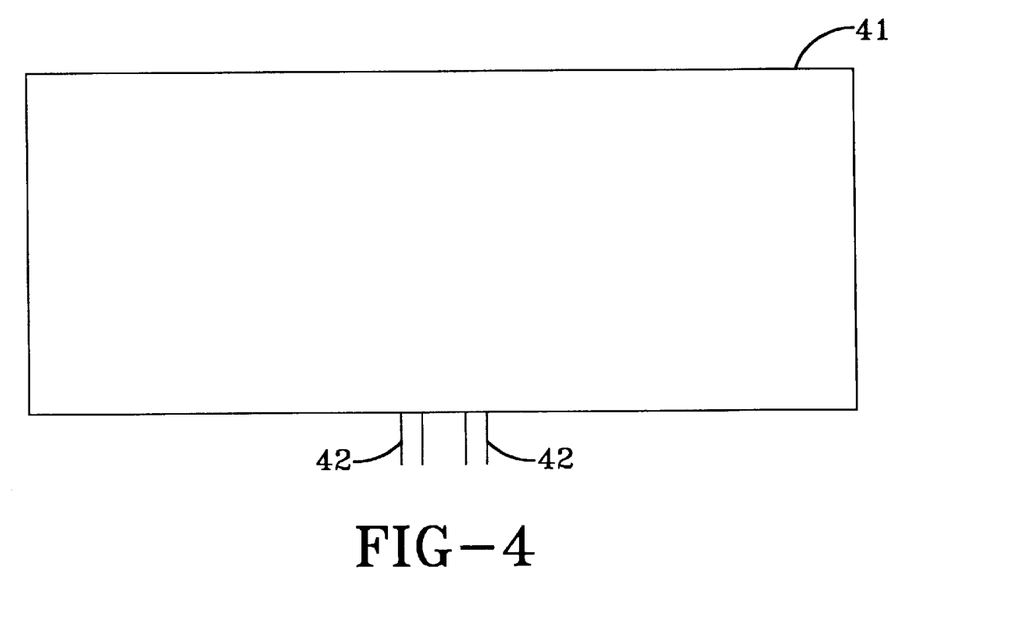
FIG. 4 shows a container for the device of FIGS. 1 and 2.

FIG. 4 shows a plan view of a container 41 for the device of FIGS. 1 and 2. The container 41 is a vacuum package which contains the device of FIG. 1 therein. The electrical leads 42 for the magnetic sensor 10 and the leads for the electrodes 15, 25 pass through airtight seals in the container 41. Methods for vacuum packaging are known in the art.

FIG. 5 shows a plan view of the flaps 20, flux concentrators 40 and sensor 10 of FIGS. 1 and 2. Flaps 20 and flux concentrators 40 include at least one hole 44 formed therein for decreasing air resistance and, therefore, energy loss, when the flaps 20 move. Preferably, a plurality of holes 44 are included.

FIG. 5 also shows mechanical connectors 46 between the flaps 20. The connectors 46 between the flaps 20 should not contain any magnetic permeable material. The mechanical connector 46 shown in FIG. 5 is semi-circular in shape. However, other shapes and configurations for the connector 46 are possible. The two connectors 46 couple the two MEMS flaps 20. This coupling has two advantages. First, the coupling will tend to keep the Hap oscillations in phase so that the two flaps 20 go up and down together. This is especially true if the modulation frequency is equal to the normal mode frequency for this motion. Second, as the flaps go up and down, the connectors 46 tend to limit the extent of the motion of the flaps 20 so that the two electrode pads 15, 25 do not come in contact with one another and become shorted. More serpentine coupling paths may also be used.

As discussed previously it is important to minimize the 1/f noise of the flux concentrator 40. The flaps 20 in FIG. 1 are coated with a soft magnetic material. The 1/f noise is minimized if the magnetization changers by domain rotation. The magnetization can be forced to change by domain rotation by coating the magnetic material onto the flaps in a special way as shown in FIG. 6.

Figure 6:
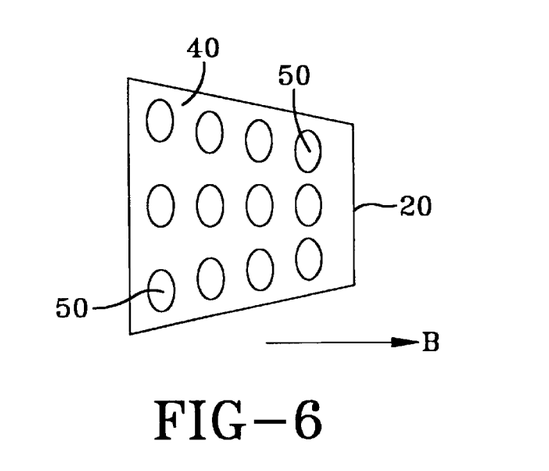
FIG. 6 is a plan view of one flap 20.

FIG. 6 is a plan view of one flap 20. The soft magnetic material can be deposited in the form of ellipses 50 using a lithograph or phase separation method. If the ellipses 50 are suitably small they will be single domains. Suitably small means less than several microns in size or, for some materials, as little as 50 nm. Thus, there are no domain walls. When the ellipses 50 are single domain the magnetization can only change by domain rotation. Having the major axis of each ellipse 50 perpendicular to the field direction B makes that direction the easy axis, i.e., in zero field the magnetization will be in the plane of the flap 20 and perpendicular to the B direction. This is the preferred direction for making a magnetic sensor that has a linear response. How much lower the energy will be in the easy axis direction can be controlled by varying the ratio of the length of the major to minor axis.

It will be understood that various combinations of the vacuum container, holes in the flaps, single domain magnetic material and the mechanical connection between the flaps may be used to maximize the performance of the invention.

While the invention has been described with reference to certain preferred embodiments, numerous changes, alterations and modifications to the described embodiments are possible without departing from the spirit and scope of the invention, as defined in the appended claims and equivalents thereof.

What is claimed is:

1. A low-frequency microelectromechanical modulating magnetic field transducer comprising:

a base structure;

a magnetic sensor attached to the base structure;

a flux concentrator on either side of the magnetic sensor, each flux concentrator having at least one hole formed therein; and a pair of complementary electrodes for each flux concentrator such that a first electrode is attached to the base structure opposite from a corresponding second electrode that is attached to the flux concentrator such that when the pair of complementary electrodes are excited by a modulating electrical signal, each flux concentrator moves at a prescribed frequency thereby minimizing 1/f-type noise.

2. The device as recited in 1, wherein each flux concentrator has a plurality of holes formed therein.

3. A low-frequency microelectromechanical modulating magnetic field transducer comprising:

a base structure;

a magnetic sensor attached to the base structure;

a flux concentrator on either side of the magnetic sensor;

a pair of complementary electrodes for each flux concentrator such that a first electrode is attached to the base structure opposite from a corresponding second electrode that is attached to the flux concentrator such that when the pair of complementary electrodes are excited by a modulating electrical signal, each flux concentrator moves at a prescribed frequency thereby minimizing 1/f-type noise; and a container for containing the base structure, the magnetic sensor the flux concentrators and the pair of complementary electrodes in a vacuum environment.

4. A low-frequency microelectromechanical modulating magnetic field transducer comprising:

a base structure;

a magnetic sensor attached to the base structure;

a flux concentrator on either side of the magnetic sensor, each flux concentrator comprising soft magnetic material in the form of elliptical shapes such that the elliptical shapes are single domains; and a pair of complementary electrodes for each flux concentrator such that a first electrode is attached to the base structure opposite from a corresponding second electrode that is attached to the flux concentrator such that when the pair of complementary electrodes are excited by a modulating electrical signal, each flux concentrator moves at a prescribed frequency thereby minimizing 1/f-type noise.

5. The device of claim 4 wherein a major axis of each elliptical shape of soft magnetic material is perpendicular to a direction of a magnetic field sensed by the magnetic sensor.

6. A low-frequency microelectromechanical modulating magnetic field transducer comprising:

a base structure;

a magnetic sensor attached to the base structure;

a flap on either side of the magnetic sensor, each flap including a flux concentrator;

a mechanical connector that connects the flaps on either side of the magnetic sensor; and a pair of complementary electrodes for each flux concentrator such that a first electrode is attached to the base structure opposite from a corresponding second electrode that is attached to the flux concentrator such that when the pair of complementary electrodes are excited by a modulating electrical signal, each flux concentrator moves at a prescribed frequency thereby minimizing 1/f-type noise.

7. The device as recited in claim 1, wherein the magnetic sensor comprises one of a Hall effect type sensor, a magnetoresistive sensor, a MEMS sensor, a magneto-diode, a magneto-transistor. a MAGFET, a fluxgate, a miniature fluxgate magnetotmeter, a SQUID and a magneto-optical sensor.

8. The device as recited in claim 3, wherein the magnetic sensor comprises one of a Hall effect type sensor, a magnetoresistive sensor a MEMS sensor, a magneto-diode, a magneto-transistor, a MAGFET, a fluxgate, a miniature fluxgate magnetometer, a SQUID and a magneto-optical sensor.

9. The device as recited in claim 4, wherein the magnetic sensor comprises one of a Hall effect type sensor, a magnetoresistive sensor, a MEMS sensor, a magneto-diode, a magneto-transistor, a MAGFET, a fluxgate, a miniature fluxgate magnetometer, a SQUID and a magneto-optical sensor.

10. The device as recited in claim 6, wherein the magnetic sensor comprises one of a Hall effect type sensor, a magnetoresistive sensor, a MEMS sensor, a magneto-diode, a magneto-transistor, a MAGFET, a fluxgate, a miniature fluxgate magnetometer, a SQUID and a magneto-optical sensor.

11. The device of claim 1 wherein each flux concentrator comprises a layer of a hard magnetic material, a spacer layer and a layer of a soft magnetic material.

12. The device of claim 11 wherein the layer of soft magnetic material is a composite of single domain magnetic particles and a nonmagnetic material.

13. The device of claim 12 wherein the volume fraction of single domain magnetic particles to nonmagnetic material is less than or equal to about fifty per cent.

14. The device of claim 11 wherein a coercivity of the hard magnetic material is greater than about 50 Oersteds and a coercivity of the soft magnetic material is less than about 3 Oersteds.

15. The device of claim 3 wherein each flux concentrator comprises a layer of a hard magnetic material, a spacer layer and a layer of a soft magnetic material.

16. The device of claim 4 wherein each flux concentrator comprises a layer of a hard magnetic material, a spacer layer and a layer of a soft magnetic material.

17. The device of claim 6 wherein each flux concentrator comprises a layer of a hard magnetic material, a spacer layer and a layer of a soft magnetic material.

18. The device of claim 2 wherein each flux concentrator comprises a layer of a hard magnetic material, a spacer layer and a layer of a soft magnetic material.

19. The device of claim 15 wherein the layer of soft magnetic material is a composite of single domain magnetic particles and a nonmagnetic material.

20. The device of claim 16 wherein the layer of soft magnetic material is a composite of single domain magnetic particles and a nonmagnetic material.

* * * * *